(12) United States Patent
Lesso et al.

(10) Patent No.: US 12,431,894 B2
(45) Date of Patent: *Sep. 30, 2025

(54) DRIVER CIRCUITRY

(71) Applicant: Cirrus Logic International Semiconductor Ltd., Edinburgh (GB)

(72) Inventors: John P. Lesso, Edinburgh (GB); John L. Melanson, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 414 days.

This patent is subject to a terminal disclaimer.

(21) Appl. No.: 17/835,276

(22) Filed: Jun. 8, 2022

(65) Prior Publication Data
US 2023/0030111 A1 Feb. 2, 2023

Related U.S. Application Data

(63) Continuation of application No. 17/381,546, filed on Jul. 21, 2021, now Pat. No. 11,381,239.

(51) Int. Cl.
*H03K 17/687* (2006.01)
*H02N 2/00* (2006.01)

(52) U.S. Cl.
CPC ....... *H03K 17/6871* (2013.01); *H02N 2/0075* (2013.01)

(58) Field of Classification Search
CPC .......... H03K 17/6871; H02N 2/0075
See application file for complete search history.

(56) References Cited

U.S. PATENT DOCUMENTS

| 9,806,682 | B1 | 10/2017 | Marcone et al. | |
| 2009/0073156 | A1* | 3/2009 | Fryer | H05B 44/00 363/8 |
| 2010/0038972 | A1 | 2/2010 | Buter et al. | |
| 2010/0156368 | A1* | 6/2010 | Huynh | H02M 3/07 307/43 |
| 2013/0334987 | A1* | 12/2013 | Garg | H10N 30/802 318/116 |
| 2017/0111017 | A1* | 4/2017 | Frith | H03F 3/2171 |

FOREIGN PATENT DOCUMENTS

EP 2701304 A1 2/2014

OTHER PUBLICATIONS

International Search Report and Written Opinion of the International Searching Authority, International Application No. PCT/GB2022/051796, mailed Sep. 27, 2022.

* cited by examiner

*Primary Examiner* — Metasebia T Retebo
(74) *Attorney, Agent, or Firm* — Jackson Walker L.L.P.

(57) ABSTRACT

The present disclosure relates to switching drivers for driving a transducer. A switching driver (202) has supply nodes for receiving supply voltages (VSH, VSL) defining at least one input voltage and an output node (104). A controller (205) controls operation of the first switching driver to generate a drive signal for the transducer at the output node (104), based on an input signal (Sin). A first capacitor (201a) is connected between first and second capacitor nodes (104, 204a) and a second capacitor (201b) is connected between the second capacitor node (204a) and a third capacitor node (204b). A network of switches (203) selectively connects any of the driver output node, the second capacitor node and the third capacitor node to either of a respective pair of said supply nodes, with the first capacitor node connected to the first driver output node.

19 Claims, 5 Drawing Sheets

DRIVER CIRCUITRY

This application is a continuation of U.S. patent application Ser. No. 17/381,546, filed Jul. 21, 2021, which is incorporated by reference herein in its entirety.

FIELD

The field of representative embodiments of this disclosure relates to methods, apparatus and/or implementations concerning or relating to driver circuits, and in particular to switching driver circuits as may be used to drive a transducer.

BACKGROUND

Many electronic devices include transducer driver circuitry for driving a transducer with a suitable driving signal, for instance for driving an audio output transducer of the host device or a connected accessory, with an audio driving signal.

In some applications the driver circuit may include a switching driver, e.g. a class-D amplifier or the like, for generating a driving signal to drive the transducer. Switching drivers can be relatively power efficient compared to linear amplifiers such as class AB amplifiers or the like, and thus can be advantageously used in some applications. A switching driver generally operates to switch an output node between defined high and low switching voltages, with a duty cycle that provides the desired voltage, on average over one or more switching cycles, for the output driving signal.

In some applications there is desire for transducer drivers to be operable to output driving signals of a relatively high magnitude.

For instance, in some applications it may be desirable for a driver to be operable to output audio driving signals for driving an audio transducer of a connected accessory. There is an increasing range of different audio accessories and at least some audio accessory apparatus may represent a relatively high impedance load, e.g. some headphone accessories may have a load impedance, for DC, of the order of several hundred ohms. To provide the desired performance to drive audio accessories that present a relatively high impedance load, it may be desirable for the audio driving circuitry to be able to generate relatively high power, large amplitude driving signals.

Additionally, or alternatively, the use of piezoelectric or ceramic transducers is increasingly of interest in some applications, due to the relatively thin form factor of such transducers. At least some piezoelectric or ceramic transducers may require relatively high amplitude driving signals.

At least some applications may thus require a switching driver to be able to generate a driving signal that can vary within a relatively high output voltage range.

To provide such an output range, the relevant high and low switching voltages for the switching driver could be set relative to peak high and low output voltages required for the driving signal at the output node. The high switching voltage could be set such that a duty cycle at or near 100% (in terms of proportion of time that the output node is connected to the high switching voltage) results in a drive signal with a voltage equal to the peak high output voltage and the low switching voltage could be set such that duty cycle at or near 0% provides the peak low voltage.

This may, however, require the difference between the high and low switching voltages to be relatively large. A large voltage change at the output node when switching between the switching voltages can result in a relatively large ripple in load current, which may be undesirable, and/or may generate unwanted EMI. Also, generating the relevant switching voltages may require boosting of at least one lower magnitude supply voltage and there may be power losses associated with such boosting.

In general, the peak output driver voltage may only be required in some use cases, e.g. for driving certain types of loads and/or outputting relatively high amplitude driving signals and, even then, may only be required for part of the output signal waveform.

SUMMARY

Embodiments of the present disclosure relate to methods and apparatus for switching drivers that at least mitigate at least some of these issues.

Thus according to a first aspect, there is provided a switching driver apparatus for driving a transducer comprising: a plurality of supply nodes for receiving supply voltages defining at least one input voltage; a first switching driver having a driver output node, and a controller for controlling operation of the first switching driver based on an input signal to generate a drive signal for the transducer at the driver output node. The first switching driver comprises: capacitor nodes for connecting, in use, to at least first and second capacitors such that the first capacitor is connected between first and second capacitor nodes and the second capacitor is connected between the second capacitor node and a third capacitor node; and a network of switches for selectively connecting any of the driver output node, the second capacitor node and the third capacitor node to either of a respective pair of said supply nodes, with the first capacitor node connected to the first driver output node.

In some examples, the plurality of supply nodes may comprise a first supply node and a second supply node and the controller may be operable to control the network of switches in each of: a first switch state in which the first supply node is coupled to the driver output node, the driver output node is coupled to the first capacitor node and the second supply node is coupled to the second capacitor node; a second switch state in which the second supply node is connected to the driver output node; a third switch state in which the driver output node is coupled to the first capacitor node, the first supply node is coupled to the second capacitor node and the second supply node is coupled to the third capacitor node; and a fourth switch state in which the driver output node is coupled to the first capacitor node and the first supply node is coupled to the third capacitor node.

In some examples, the controller may be operable to control the first switching driver in a first driver mode which switches between the first switch state and the second switch state. In some examples, the controller may be operable to control the first switching driver in a second driver mode which switches between the third switch state and the first switch. In some examples, the controller may be operable to control the first switching driver in a third driver mode which switches the fourth switch state and the third switch state.

In some implementations, the network of switches may comprise: a first switch for selectively connecting the driver output node to a first supply node; a second switch for selectively connecting the driver output node to a second supply node; a third switch for selectively connecting the second capacitor node to the first supply node; a fourth switch for selectively connecting the second capacitor node to the second supply node; a fifth switch for selectively connecting the third capacitor node to the first supply node; and a sixth switch for selectively connecting the third capacitor node to the second supply node. The network of switches may further comprise a seventh switch for selectively connecting the first capacitor node to the driver output node.

In some implementations, the switching driver apparatus may further comprise a second driver output node. The network of switches may further comprise: an eighth switch for selectively connecting the second driver output node to the first supply node; a ninth switch for selectively connecting the second driver output node to the second supply node; and a tenth switch for selectively connecting the first capacitor node to the second driver output node.

In some examples, the switch network may be configured such that one of the driver output node, second capacitor node and third capacitor node may be selectively connected to a first pair of supply nodes and another of the driver output node, second capacitor node and third capacitor node may be selectively connected to a second pair of supply nodes, wherein at least one of the supply voltages of the first pair of supply nodes is different to the supply voltages of the second pair of supply nodes.

In some examples, each of the switches of the network of switches may comprise a NMOS transistor. At least some of the NMOS switches may comprise a bootstrap circuit.

The network of switches may be operable such that, in use, the voltage of at least one of the second and third capacitor nodes may go negative. In such examples, at least one switch of the switch network which is connected between one of the second and third capacitor nodes and the second supply node may be configured to prevent conduction via a body diode.

In some examples, the first and second capacitors have the same electrical properties and dimensions as one another.

In some implementations, the switching driver apparatus may further comprise: a second switching driver having a respective driver output node. The switching driver apparatus may be configured to drive the transducer in a bridge-tied-load configuration between the driver output nodes of the first and second switching drivers.

In some examples, the controller may be operable: in a first BTL mode to control the network of switches of one of the first and second switching drivers in the first switch state and the network of switches of the other one of the first and second switching drivers in the second switch state to generate a differential voltage across the load with a magnitude equal to the input voltage; in a second BTL mode to control the network of switches of one of the first and second switching drivers in the third switch state and the network of switches of the other one of the first and second switching drivers in the second switch state to generate a differential voltage across the load with a magnitude equal to twice the input voltage; and in a third BTL mode to control the network of switches of one of the first and second switching drivers in the fourth switch state and the network of switches of the other one of the first and second switching drivers in the second switch state to generate a differential voltage across the load with a magnitude equal to three time the input voltage.

In some examples, the controller may be operable to selectively control one of the first and second switching drivers to switch its respective output node between different switching voltages over the course of a switching cycle whilst the other of the first and second switching drivers maintains a constant voltage.

The transducer may be at least one of: an audio output transducer; a haptic output transducer; piezoelectric transducer; and a ceramic transducer.

According to another aspect there is provided a switching driver apparatus for driving a transducer comprising: first and second supply nodes for receiving first and second supply voltages defining an input voltage; a first driver output node for outputting a drive signal for the transducer, capacitor nodes for connecting, in use, to a plurality of capacitors; and a network of switches selectively connecting said first and second supply nodes to said first driver node or the capacitor nodes, the network of switches being operable such that each of the plurality of capacitors can be selectively connected between the first and second supply nodes to be charged to the input voltage and operable such that the first supply node can be connected to the first driver output node with selectively none, one or more of the plurality of capacitors in a path between the first supply node and the first driver output node.

The switching driver apparatus may further comprise: a second driver output node for driving a transducer in a bridge-tied-load configuration between the first and second driver output nodes, and capacitor nodes for connecting, in use, to a second plurality of capacitors; wherein the network of switches is operable such that each of the second plurality of capacitors can be selectively connected between the first and second supply nodes to be charged to the input voltage and operable such that the first supply node can be connected to the second driver output node with selectively none, one or more of the second plurality of capacitors in a path between the first supply node and the second driver output node.

In a further aspect there is provided a switching driver apparatus for driving a transducer comprising: first and second supply nodes for receiving first and second supply voltages defining an input voltage; a first switching driver having a driver output node for outputting a drive signal for the transducer, capacitor nodes for connecting, in use, to first and second capacitors; and a network of switches selectively connecting said first and second supply nodes to said first driver node or the capacitor nodes. The network of switches is operable in a plurality of switch states; wherein: in one of the plurality of switch states the first capacitor is connected between the first and second supply nodes; in one of the plurality of switch states the second capacitor is connected between the first and second supply nodes; in one of the plurality of switch states the both the first and second capacitors are connected in series between the first supply node and the driver output node; in one of the plurality of switch states just one first and second capacitors is connected in series between the first supply node and the driver output node; and in one of the plurality of switch states the first supply node is connected to the driver output node with neither of the first and second capacitors in series.

In a further aspect there is provided a switching driver apparatus for driving a transducer comprising: first and second supply nodes for receiving first and second supply voltages; first and second driver output nodes for driving a load in a bridge tied load configuration; first and second capacitor nodes for connecting to a capacitor; and a network of switches configured so as to selectively connect: the first driver output node to either of the first and second supply voltages; the second driver output node to either of the first and second supply voltages; the first capacitor node to either of the first and second driver output nodes; or the second capacitor node to either of the first and second supply voltages.

In a further aspect there is provided a switching driver comprising: first and second switching legs, each switching leg comprising a switching node and a first switch for connecting the switching node of that switching leg to a high side voltage supply and a second switch for connecting the switching node of that switching leg to a low side voltage supply; wherein the switching node of the second switching leg is connected to the switching node of the first switching leg via a capacitor and a connection switch; and wherein the first and second switches of the first switching leg are implemented by first and second NMOS transistors respectively.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Figure 1:
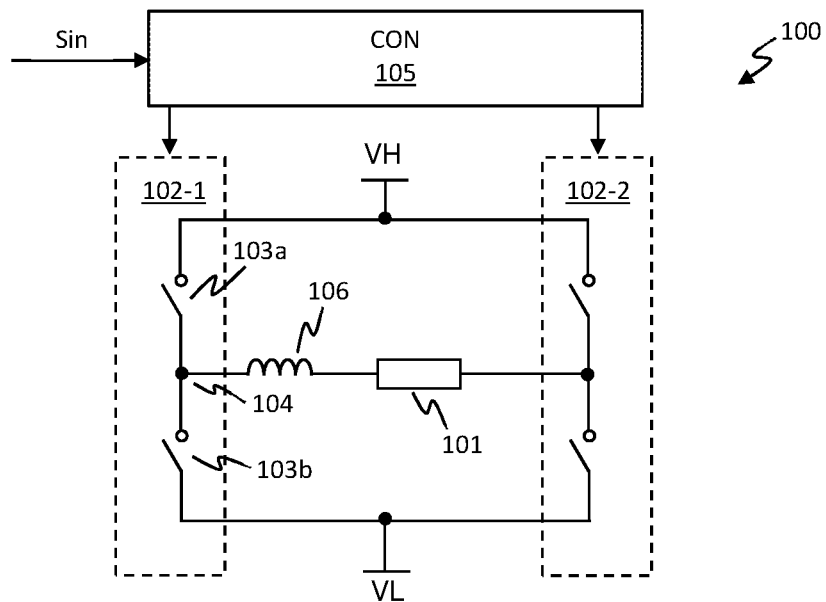
FIG. 1 illustrates a conventional switching driver circuit.

FIG. 1 illustrates one example of a conventional switching driver circuit 100 for driving a load 101, for example a transducer such as an audio output transducer or haptic transducer.

In this example, the load 101 is connected in a bridge-tied-load (BTL) configuration and each side of the load is connected to a respective half-bridge switching driver 102-1 and 102-2, (which may be referred to collectively or individually as a switching driver 102) such that the load 101 is driven by a full-bridge arrangement. It will be understood, however, that single-ended driving circuits may be used in some implementations, where one side of the load is connected to a switching driver 102 and the other side of the load is coupled, in use, to a defined voltage such as ground.

Each switching driver 102 comprises switches 103a and 103b, which may typically comprise MOSFETs, for selectively connecting an output node 104 to a high-side voltage VH or a low-side voltage VL. In some examples the high-side voltage VH could be a supply voltage and the low-side voltage could be ground. In this example the high-side voltage VH and low-side voltage VL define an input voltage, Vin=VH−VL, for the driver circuit.

The switches 103a and 103b of the switching drivers 102 are controlled by switching signals generated by a controller 105, based on an input signal Sin which may, for instance, be an input audio signal. The controller 105 may comprise one or more modulators (not separately illustrated) and may be configured to generate PWM or PDM switching signals based on the input signal Sin, as will be understood by one skilled in the art, to control the duty cycle of the switches 103a and 103b of the respective switching drivers 102a and 102b.

In some examples, the output path from at least one of the output nodes 104 to the load may comprise one or more passive components, for example to provide some filtering. FIG. 1 illustrates, for example, that the output path from the switching driver 102-1 to the load 101 includes a series inductance 106, which may be included to suppress the switching ripple of the output voltage and present a high impedance at the output node 104 for the FET switches 103a and 103b at and above the switching frequency, whilst allowing current to flow to the load 101 in the signal band of interest, e.g. at audio frequencies.

In use, the controller 105 controls the switches of the switching drivers 102-1 and 102-2 so as to apply a differential driving voltage across the load 101 that has a value, on average over one or more switching cycles, based on the input signal Sin. The controller 105 may control the switching drivers 102 to adopt various switch states.

In a first switch state, the output node 104 of the first switching driver 102-1 may be connected to the high-side voltage VH and the output node 104 of the second switching driver 102-2 may be connected to the low-side voltage VL. This results in a voltage of +Vin=VH−VL being applied across the load (defining, for this example, positive polarity as the voltage at the output of output stage 102-1 being more positive than the voltage at the output of output stage 102-2).

In a second switch state, the output node 104 of the first switching driver 102-1 may be connected to the low-side voltage VL with the output node 104 of the second switching driver 102-2 connected to the high-side voltage VH to apply a voltage of −Vin=VL−VH across the load.

In some implementations the controller 105 may control the switching drivers 102-1 and 102-2 to alternate between just these two switch states. In some implementations the controller 105 may additionally control the switching drivers 102-1 and 102-2 to provide at least one state where both side of the load are connected to the same voltage so as to apply a differential voltage of 0V across the load. Both sides of the load could be connected to the low-side voltage VL to provide a 0V (L) state or both sides of the load could be connected to the high-side voltage VH to provide a 0V (H) state.

In any case, the controller 105 controls the switching of the switches of the switching drivers 102-1 and 102-2 with controlled duty cycles such that the differential driving voltage across the load is, on average over the course of one or more switching cycles, equal to the desired driving voltage based on the input signal Sin.

The differential driving signal can thus vary within a range of +Vin to −Vin and the high-side and low-side switching voltages VH and VL should thus be set with respect to the maximum magnitude driving signals desired in use, e.g. the desired peak output voltage magnitude at maximum amplitude. Thus, to provide a maximum magnitude driving signal of Vmax, the input voltage Vin should be at least equal to, or in practice greater than, Vmax.

In some applications, the desired maximum magnitude of output voltage may be relatively high, for instance of the order of several voltages or several tens of volts, which thus requires the input voltage Vin (defined by VH−VL) to be correspondingly high. As the output node 104 is switched between VH and VL, this large change in voltage at the output node can result in a high load current ripple and possibly a relatively high amount of EMI. It will be understood that for the conventional switching driver illustrated in FIG. 1, the output node will be switched between these switching voltages VH and VL even when the magnitude of the driving signal is relatively low, and generating and switching between relatively high switching voltages may have associated power losses.

Embodiments of the present disclosure provide apparatus and methods for switching driver circuits in which the switching voltages, between which the output node may be switched, may be controllably varied in use, that is the output node may be switched between more than just two defined switching voltages. Switching drivers according to an embodiment may be operable such that the driver output node may be switched between switching voltages which differ from one another by an amount less than the full output range of the switching driver and to control the switching voltages in use to provide the full output range. That is, the switching driver may be operable to switch between a first set of switching voltages to provide an output drive voltage in a first range (which is only a subset of the full output range of the switching driver) and, when required, to operate with a different set of switching voltages to provide an output voltage in a second, different range.

Figure 2:
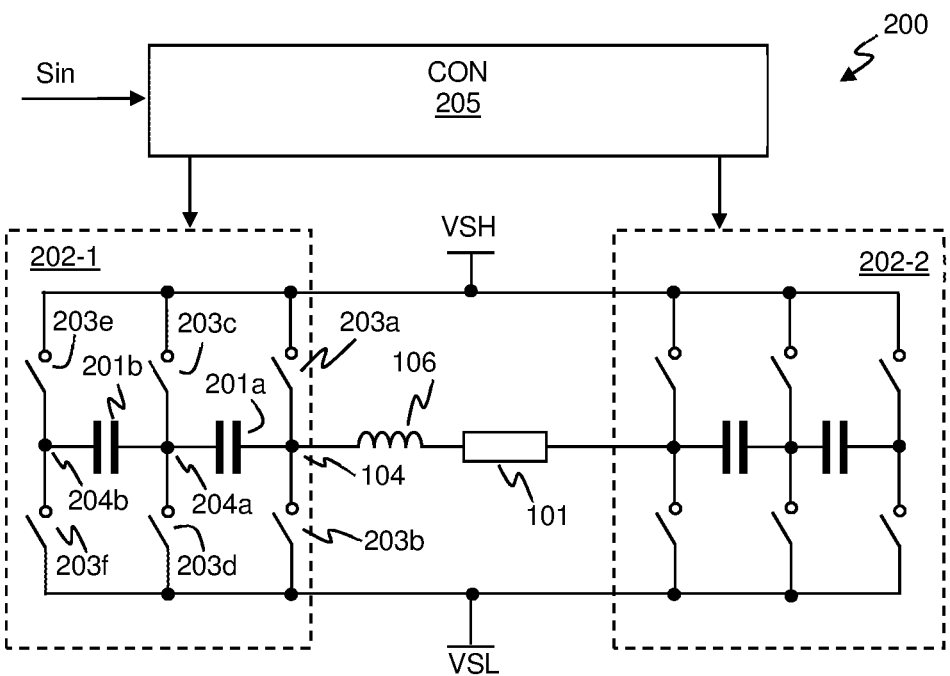
FIG. 2 illustrates a switching driver circuit according to an embodiment.

FIG. 2 illustrates one example of a switching driver circuit 200 according to an embodiment, in which similar components as discussed with reference to FIG. 1 are identified by the same reference numerals. FIG. 2 illustrates that the switching driver circuit has inputs for receiving high-side and low-side supply voltages, which in this example are VSH and VSL, defining an input voltage Vin. The switching driver circuit 200 of FIG. 2 also includes first and second switching drivers 202-1 and 202-2 (which may be referred to individually or collectively as a switching driver 202) each having a respective output node 104, with the first and second switching drivers 202-1 and 202-2 being configured to drive a load 101 in a bridge-tied-load configuration between the respective output nodes.

Each switching driver includes a plurality of capacitors 201, in this example first and second capacitors 201a and 201b, and a network of switches 203, in this example six switches 203a-f.

The switching driver 202 is configured such that each of the capacitors 201a and 201b may be charged to a voltage, which may conveniently be the input voltage Vin, and then selectively connected to the output node 104 to provide a boosted voltage at the output node. In the example of FIG. 2, the first and second capacitors are connected in series with one another and connected to the output node 104. Thus the first capacitor is connected between first and second capacitor nodes, which in this case are the output node 104 and node 204a. The second capacitor is connected between second and third capacitor nodes, which in this case are the nodes 204a and 204b respectively. As will be understood by one skilled in the art, at least some of the switching driver 202 may be implemented as an integrated circuit and in some implementations the capacitors 201 may be implemented as part of the integrated circuit. In some implementations, however, it may not be practical or desirable to integrate the capacitors 201 and thus the capacitors may be formed as external or "off-chip" components and connected via suitable terminals.

The capacitors 201a and 201b may have the same electrical properties as one another, e.g. may have the same capacitance value, and may conveniently have the same physical dimensions, for instance when implemented as off-chip components the capacitors may have the same package size, which can simply layout design.

In the example of FIG. 2, the network of switches 203 is operable such that any of the output node 104 (which in this example is also the first capacitor node), the second capacitor node 204a and the third capacitor node 204b can be selectively connected to either of the first or second supply nodes. The switching driver illustrated in FIG. 2 comprises six switches, which comprise first and second switches 203a and 203b for selectively connecting the output/first capacitor node 104 to high-side supply VSH or the low-side supply VSL; third and fourth switches 203c and 203d for selectively connecting the second capacitor node 204a to the high-side supply VSH or the low-side supply VSL and fifth and sixth switches 203e and 203f for selectively connecting the third capacitor node to the high-side supply VSH or low-side supply VSL.

In use, the switching driver 202 may be controlled to switch between at least four different switch states, as illustrated in FIGS. 3a-d.

Figure 3A:
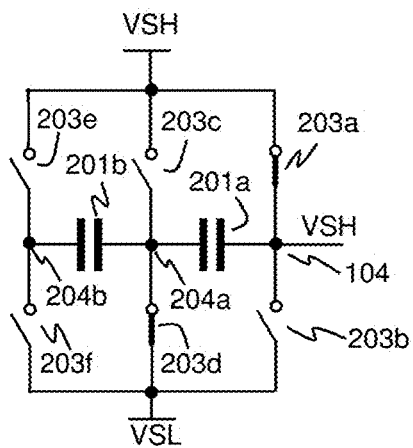
FIGS. 3a-d illustrate various possible switch states for the switching driver.

In a first switch state, illustrated in FIG. 3a, switch 203a is closed to connect the output/first capacitor node 104 to the high-side supply VSH. In addition, switch 203d is closed to connect the second capacitor node to the low side supply VSL. The remaining switches are open. This results in the output node 104 being driven to the high-side supply voltage VSH and also connects the first capacitor between the supply voltages so as to charge (or recharge) this capacitor to the input voltage Vin (=VH−VL).

Figure 3B:
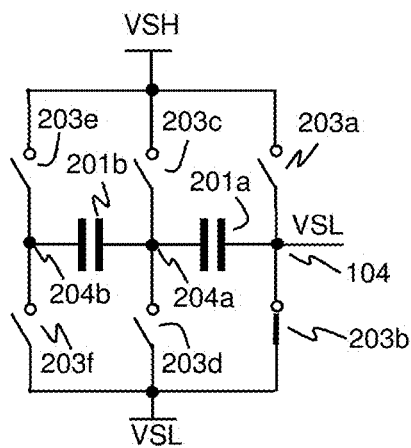

In a second switch state, illustrated in FIG. 3b, switch 203b is closed to connect the output node 104 to the low-side supply VLS and remaining switches are open. This results in the output node 104 being driven to the low-side supply voltage VSL and also connects the first capacitor between the supply voltages so as to charge (or recharge) this capacitor to the input voltage Vin (=VH−VL).

Figure 3C:
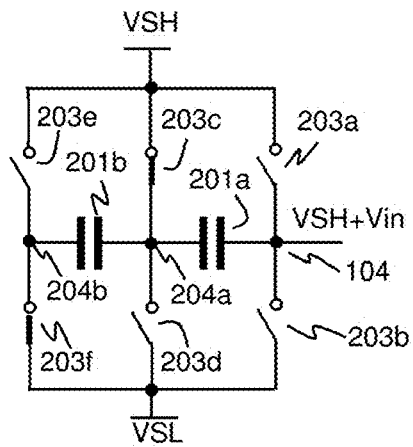

In a third switch state, illustrated in FIG. 3c, switch 203c is closed to connect the second capacitor node 204a to the high-side supply VSH. In addition, switch 203f is closed to connect the third capacitor node to the low side supply VSL. The remaining switches are open. This results in the charged first capacitor being connected between the high-side supply VSH and the output node 104, and thus boosts the voltage at the output node 104 to VSH+Vin. This state also connects the second capacitor between the supply voltages so as to charge (or recharge) this second capacitor to the input voltage Vin (=VH−VL).

In a fourth switch state, illustrated in FIG. 3a, switch 203e is closed to connect the third capacitor node 204b to the high-side supply VSH and the remaining switches are open. This results in the charged first and second capacitors being connected in series between the high-side supply VSH and the output node 104, to boost the voltage at the output node 104 to VSH+2Vin.

The output node 104 can thus, in this example, be selectively switched between four different switching voltages, in this case the supply voltages VSH or VSL, or the high-side supply voltage VSH boosted by the input voltage Vin or by twice the input voltage. If the low-side supply voltage is ground, such that the high-side supply voltage is equal to Vin, the various switching voltages are thus equal to 0V, Vin, 2Vin and 3Vin.

It will be understood that the switch states illustrated in in FIG. 3a-d charge the capacitors 202a and 202b so that the plate connected on the side of the output node is positive and then selectively connect these capacitors to provide positive boosting of the high-side supply voltage. It would alternatively be possible to charge the capacitors 201a and 201b to the opposite polarity and then selectively connect the capacitors to provide negative boosting of the low-side supply voltage. For instance closing switches 203b and 203c together in one state, with the other switches open, would drive the output node 104 to the low-side supply voltage whilst charging the first capacitor to the input voltage, but with the negative plate on the side of the output node. In another state, closing switches 203d and 203e would drive the output node to VSL−Vin, whilst charging the second capacitor 201b. With input supply voltages of Vin and 0V, the switching driver could thus be alternatively operated in four switch states to provide voltages of Vin, 0V, −Vin and −2Vin.

It would be possible to selectively swap between positive boosting and negative boosting in use, but in changing from positive boosting to negative boosting the capacitors would need to be discharged before being recharged to the opposite polarity, which is generally inefficient and undesirable. Thus generally, in most applications, the switching driver may be operated to provide positive boosting or negative boosting only. This disclosure will generally describe positive boosting, but it will be understood that the same principles apply to negative boosting.

Referring back to FIG. 2, the controller 205 is configured to control the operation of each of the switching drivers to generate a drive signal for the transducer at the driver output node based on the input signal.

For the BTL arrangement of FIG. 2, each of the switching drivers 202-1 and 202-2 may be selectively operable in the four switch states described with reference to FIGS. 3a-d. Thus the output node 104 can be switched between four different possible switching voltages, e.g. 0V, Vin, 2Vin and 3Vin in the case where the low-side switching voltage is 0V. This can provide seven different instantaneous differential voltages across the load. Table 1 below lists one example of the various differential voltages may be achieved, where Vdiff is the differential voltage across the load Vx1 and Vx2 are the voltages at the output node nodes of the first and second switching drivers 202-1 and 202-2 respectively, and St1 and St2 indicate the switch state of the first and second switching drivers 202-1 and 202-2.

TABLE 1

| Vdiff | Vx1 | Vx2 | St1 | St2 |
|---|---|---|---|---|
| +3Vin | 3Vin | 0 | 3d | 3b |
| +2Vin | 2Vin | 0 | 3c | 3b |
| +Vin | Vin | 0 | 3a | 3b |
| 0 (low) | 0 | 0 | 3b | 3b |

TABLE 1-continued

| Vdiff | Vx1 | Vx2 | St1 | St2 |
|---|---|---|---|---|
| 0 (high) | Vin | Vin | 3a | 3a |
| −Vin | 0 | Vin | 3b | 3a |
| −2Vin | 0 | 2Vin | 3b | 3c |
| −3Vin | 0 | 3Vin | 3b | 3d |

This can be seen as providing at least first BTL mode in which a differential voltage magnitude equal to the input voltage Vin is generated across the load, a second BTL mode in which a differential voltage magnitude equal to twice Vin is generated across the load; and a third BTL mode in which a differential voltage magnitude equal to the three times the input voltage Vin is generated across the load (as well as possibly at least one BTL mode in which a zero differential voltage is generated across the load).

The controller 205 is configured to control the switching of the first and second switching drivers 202-1 and 202-2 to switch between these different switching configurations with a duty cycle that results in the desired differential voltage (on average across one or more switching cycles) across the load.

It will be understood that at least some of these differential voltages could additionally or alternatively be achieved by other combination of switch states. For example, the differential voltage Vdiff=+2Vin could alternatively be achieved by Vx1=3Vin (St1=3d) and Vx2=Vin (St2=3a) and the differential voltage Vdiff=+Vin could alternatively be achieved by Vx1=3Vin (St1=3d) and Vx2=2Vin (St2=3c) or by Vx1=2Vin (St1=3c) and Vx2=Vin (St2=3c)

In use, the output node 104 of each individual switching driver may be switched between selected ones of the possible switching voltages. For instance in a first driver mode the switching driver may be switched between the switch states illustrated in FIGS. 3a and 3b to switch the output node 104 between the high-side and low side-supply voltages VSH and VSL. In this mode, the voltage at the output node 104 (averaged over the course of one or more switching cycles) may thus be controlled in the range VSL to VSH. In a second driver mode the switching driver may be switched between the switch states illustrated in FIGS. 3a and 3c to switch between the high-side supply voltages VSH and the boosted voltage VSH+Vin. In this mode, the voltage at the output node 104 (averaged over the course of one or more switching cycles) may thus be controlled in the range VSH to VSH+Vin. In a third driver mode the switching driver may be switched between the switch states illustrated in FIGS. 3c and 3d to switch between the boosted voltage VSH+Vin and the boosted voltage VSH+2Vin. In this mode, the voltage at the output node 104 (averaged over the course of one or more switching cycles) may thus be controlled in the range VSH+Vin to VSH+2Vin.

These different driver modes of operation effectively provide different output voltage ranges for the driving signal at the output of the switching driver, with each mode corresponding to an output voltage range which is a subset of the full output range. Operating in the different driver modes and swapping between different driver modes based on the input signal can allow a relatively large output voltage range to be provided, but without requiring the output node to be continually switched between two switching voltages that differ by a large amount. This can be beneficial in reducing switching current ripple and EMI.

For single-ended driver circuits, with a switching driver 202 arranged to drive one side of the load only, the controller 205 could control the switching driver to selectively vary between these driver modes of operation based on the input signal so that relevant driver mode with an appropriate output range for the required driving signal is selected.

For BTL driver circuits, such as illustrated in the FIG. 2, there are various ways in which the controller 205 may control the switching of the first and second switching drivers 202-1 and 202-2 to generate the desired driving signal.

In some implementations, the switching drivers 202-1 and 202-2 on both sides of the load may be switched between respective switching voltages over the course of a switching cycle, and the relevant switching voltages and duty cycles controlled to provide the desired driving signal. Advantageously, each switching driver may be selectively controlled to operate in one of the first to third modes describes above, and to vary the mode of operation as required based on the input signal Sin. Operating in this way limits the voltage change at the relevant output node over the course of a switching cycle, as the output node of each switching driver is switched between switching voltages that differ from one another by an amount equal to the input voltage.

For instance, for the example described above, where low-side supply voltage VSL is ground and the high-side supply voltage VSH is equal to Vin, for driving signals with a magnitude less than Vin, both switching drivers 202-1 and 202-2 could be controlled in the first mode to switch between switching voltages of Vin and 0V (i.e. between the switch states of FIGS. 3a and 3b) with appropriate duty-cycles.

If the signal level of the required driving signal increases, then the controller may control one of the switching drivers (e.g. driver 202-1 for a positive driving signal) to transition to the second mode, so as to switch between 2Vin and Vin, with a corresponding decrease in duty cycle. The other switching driver (e.g. 202-2) may continue to operate in the first mode and thus switch between Vin and 0V, but with an appropriate change of duty-cycle to maintain the desired differential voltage across the load at the point of transition. If the magnitude of the required driving signal increases further, the relevant switching driver (e.g. driver 202-1 for a positive driving signal), could transition to the third mode and switch between 3Vin and 2Vin, whilst the other switching driver still operates in the first mode. If the magnitude of the driving signal decrease, the switching driver 202-1 could transition back to operating in the second mode and then the first mode as appropriate. For higher magnitude negative driving signals the switching driver 202-2 could be controlled to operate in the second or third mode as appropriate, with the switching driver 202-1 operating in the first mode.

In some embodiments, however, the controller 205 may be configured so that, for at least some output signal magnitudes, only one of the switching drivers 202-1 and 202-2 is active to switch between different switching voltages and the other switching driver is used to maintain a constant voltage over the course of the switching cycle. For example, for producing a positive driving voltage, the switching driver 202-1 could be operated in the first mode (switching between VSH and VSL), the second mode (switching between VSH+Vin and VSH) or the third mode (switching between VSH+2Vin and VSH+Vin) as appropriate, whilst the output of switching driver 202-2 is maintained a constant voltage, which may conveniently be the low-side supply VSL (although some other voltage could be used if desired). For negative voltages, switching driver 202-1 could instead be maintained at the constant voltage and switching driver 202-2 operated in an appropriate one of the first, second or third modes.

The controller 205 may thus be operable to control the switching drivers 202-1 and 202-2 so as to generate a differential driving signal by applying a modulation with a controlled duty to just one side of the load at a time, and to controllably vary which side of the load is modulated based on the input signal so as to provide the full output range for the differential driving signal.

The switching drivers of FIG. 2 each comprise first and second capacitors 201a and 201b, each of which can be charged to the input voltage Vin, a switch network so that the first capacitor alone, or the first and second capacitors in series, can be selected connected to the output node to provide a boosted voltage. It will be understood that other embodiments may be implemented with a greater number of capacitors to allow for additional voltage boosting, and thus allow more different possible switching voltages at the output node.

Figure 4:
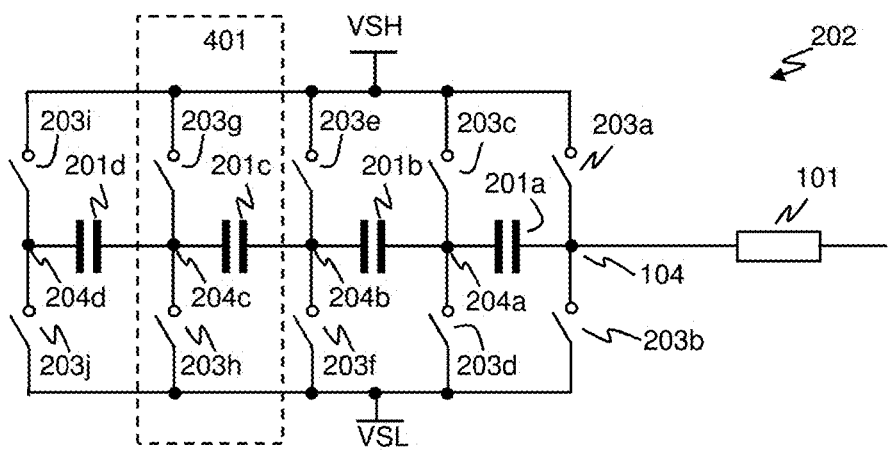
FIG. 4 illustrates another example of a switching driver circuit according to an embodiment.

For example, FIG. 4, illustrates an example embodiment of a switching driver 202 with four capacitors, so with additional capacitors 201c and 201d compared to the embodiment of FIG. 2. The embodiment of FIG. 4 also comprises additional switches 203g-j.

Each of the additional capacitors 201c and 201d can also be selectively charged to the input voltage Vin and then selectively connected to the output node 104 to provide voltage boosting. For instance, in a state with switch 203e closed to connect the first and second capacitors to the output node 104 to provide an output voltage of VSH+2Vin, switch 203h can be closed to charge the third capacitor 201c. In another state, switch 203g can be closed so that voltage at the output node is driven to VSH+3Vin, with switch 203j also closed so as to charge the fourth capacitor 201d. In a further state, switch 203i can be closed to drive the voltage at the output node 104 to VSH+4Vin.

This embodiment can thus switch the output node 104 between five different possible switching voltages. If the low side supply voltage is ground, so VSH=Vin, the switching driver 202 of FIG. 4 can provide an instantaneous output voltage of any of Vin, 2Vin, 3Vin, 4Vin or 5Vin. If the switching driver 202 of FIG. 4 were used in a BTL arrangement, such as illustrated in the FIG. 2, the differential voltage Vdiff could be any of +5Vin, +4Vin, +3Vin, +2Vin, +Vin, 0V, −Vin, −2Vin, −3Vin, −4Vin or −5Vin.

In the examples of FIGS. 2 and 4, each switching driver 202 can be seen as having a plurality of switching legs or branches, each switching branch comprising a pair of switches connected between the high-side supply and low-side supply, and having a midpoint node, which may be referred to as a switching node, as an output for that switching branch. Thus switches 203a and 203b form a first switching branch, akin to a conventional half bridge output stage. The switching node of each subsequent switching branch is connected to the switching node of the preceding switching branch by a capacitor. The combination 401 of the pair of switches of a switching leg or branch and the capacitor connecting it to the preceding switching leg or branch can be seen as a selective boost stage, and thus the switching driver may comprise a first switching branch, or half-bridge output stage and a plurality of selective boost stages 401. The number of selective boost stages 401 may be selected for a particular application, for instance based on the available supply voltage, the required maximum output voltage and/or a desired number of different switching voltages.

In the examples of FIGS. 2 and 4, each of the switching legs or branches of a switching driver is connected between the same supply voltages, i.e. between the high-side and low-side supply voltages VSH and VSL. In some implementations, however, one or more of the switching legs may be connected to a different high-side voltage and/or a different low-side voltage to one or more of the other switching legs.

Figure 5:
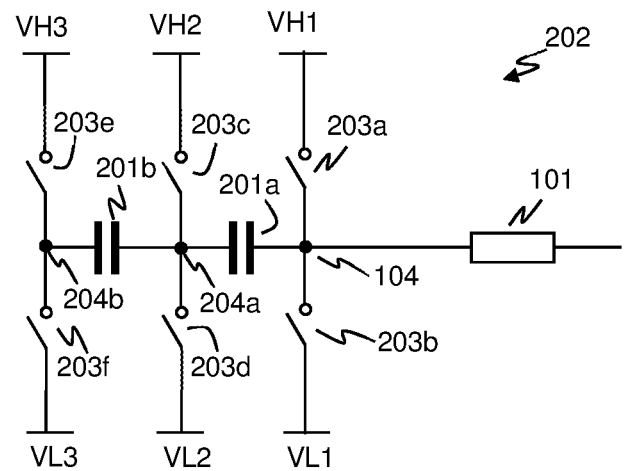
FIG. 5 illustrates an example of a switching driver circuit with different supply voltages.

FIG. 5 illustrates an example of a switching driver 202 comprising a plurality of switching legs and illustrates that the switches of each switching leg, e.g. switches 203a and 203b of a first switching leg, are connected between a respective pair of supply nodes for receiving high-side and low-side voltages, i.e. VH1 and VL1 for the first switching leg, VH2 and VL2 for the second switching leg and VH3 and VL3 for the third switching leg. FIG. 5 illustrates just three switching legs but the principles apply to switching drivers with more switching legs as discussed with reference to FIG. 4.

At least some of the high-side or low-side supply voltages may be different for the different switching legs, although some of the legs may receive at least one voltage which is the same as a voltage received by another switching legs, for example the low-side voltage for each of the switching legs could be ground (i.e. VL1=VL2=VL3=0V), but the high-side voltages could be different for at least some of the switching legs.

The switching driver of FIG. 5 may generally be operated in a similar manner as described above, i.e. such that each capacitor 201a-c can be charged by the relevant supply voltages and then selectively connected in series to provide voltage boosting.

For example, in one state switches 203a and 203d could be closed (with the other switches open) to connect the output node 104 to the supply voltage VH1 and, at the same time, to charge capacitor 204a to a voltage equal to VH1−VL2. In another state, switches 203c and 203f could be closed (with the other switches open) to connect the supply voltage VH2 to the output node 104 via charged capacitor 201a, to boost the voltage at the output node 104 to VH2+(VH1−VL2), whilst charging capacitor 201b to a voltage equal to VH2−VL3. In a further state, switches 203e and 203h could be closed (with the remaining switches open) to connect the output node to supply voltage VH3 via capacitors 201a and 201b in series, so that the output node voltage is boosted to VH3+(VH2−VL3)+(VH1−VL2).

Using different supply voltages for at least some of the switching legs or branches means that the different switching voltages that can be supplied to the output node 104 can vary from one another by different amounts. This can allow a desired balance between a difference in switching voltages in different modes of operation whilst also allowing a sufficient overall output voltage range.

Using different supply voltages for different switching legs does require different supply voltages to be available, but in at least some implementation multiple different supply voltages may be available in any case for other circuitry and thus there may be no overhead associated with generation of these voltages.

In some cases, the voltage supply for one or more switching legs may be selectively varied in use, e.g. the high side supply for a given switching leg may be selectively connected to any of two or more possible supply voltages.

As discussed above, switching drivers according to embodiments of the disclosure may be implemented to drive a load in a single-ended configuration, with the other side of the load being maintained at a DC voltage, or may be implemented to drive a load with a differential voltage in a BTL configuration.

In some BTL examples, the switching driver circuit may comprise a network of switches which is configured such that same capacitors can be selectively charged and connected to either of a first driver output node or a second driver output node to provide switching voltages for that driver output node.

Figure 6:
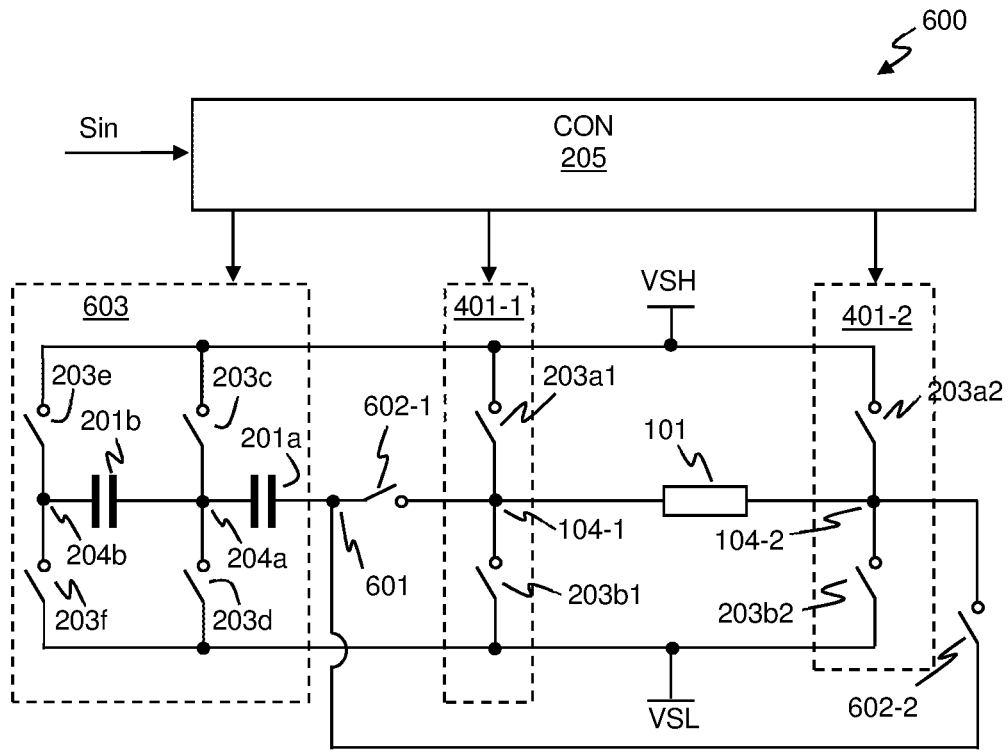
FIG. 6 illustrates an example of a switching driver circuit according to another embodiment.

FIG. 6 illustrates one example of a switching driver circuit 600 according to an embodiment. FIG. 6 illustrates a first driver output node 104-1 which is part of a first switching leg 401-1 with switches 203a1 and 203b1 and a second driver output node 104-2 which is part of a second switching leg 401-2 with switches 203a2 and 203b2.

The switching driver circuit also switches 203c-f forming two additional switching legs in a similar manner as described above, but in this example capacitor 201a is connected between a first capacitor node 601 and second capacitor node 204a and the circuit comprises switches 602-1 and 602-2 for selectively connecting the first capacitor node 601 to either of the first driver output node 104-1 or the second driver output node 104-2. In this way the capacitors 201a and 201b, together with the switches 203c-f effectively provide a variable voltage stage 603 that can be used to provide a selectively variable voltage to the selected driver output node 104-1 or 104-2.

For positive driving signals, switch 602-1 may be closed, with switch 602-2 closed, so as to connect the first capacitor node 601 to the first driver output node 104-1. The switches 203a1, 203b1 and 203c-f may then be controlled in the same manner as discussed with reference to FIGS. 2 and 3 so as to switch between different switching voltages to generate the desired driving signal. In this case the switches 203a2 and 203b2 of the switching leg 401-2 may be controlled with a suitable duty cycle or may be switched to provide maintain a constant voltage, e.g. VSL, over the course of a switching cycle.

For negative differential driving voltages, switch 602-1 may be opened, and switch 602-2 closed and 203a2, 203b2 and 203c-f may then be controlled in the same manner as discussed with reference to FIGS. 2 and 3. For instance, with switch 203a2 closed, to drive the second driver output node 104-2 to the high-side supply voltage VSH, switch 203d may be closed to (re)charge the capacitor 201a to the input voltage. With switches 203c and 203f closed, the second driver output node is driven to VSH+Vin, whilst the capacitor 204b is charged and with switch 203e closed, the second driver output node is driven to VSH+2Vin.

It will be noted that FIG. 6 illustrates that the switching legs of the variable boost stage receive the same voltage supplies as one another and as the switching legs 401-1 and 401-2, but in some examples the supplies to at least some switching legs could differ from one another.

The principle of a variable voltage capacitor stage that can be used to selectively provide a controlled switching voltage to the output node on either side of a BTL switching driver represent another aspect of this disclosure, which may be implemented with any number of capacitors. There may, in some examples, be additional switching legs with associated capacitors such as discussed with respect to FIG. 4, but, in some embodiments, there may be a single capacitor as illustrated in FIG. 7.

Figure 7:
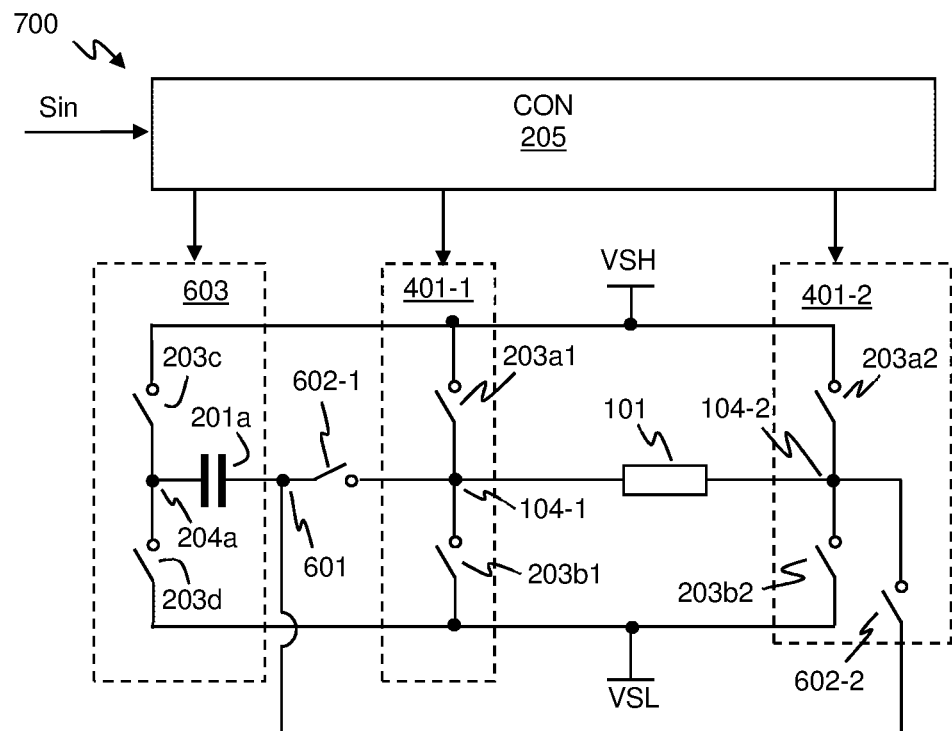
FIG. 7 illustrates an example of a switching driver circuit with a single capacitor.

FIG. 7 illustrates a switching driver circuit 700 which is similar to that discussed with reference to FIG. 6, but where the variable voltage stage 603 comprises one switching leg or branch with an associated capacitor. In this example, the variable boost stage 603 may be selectively operated with either the first switching leg 401-1 or second switching leg 401-2 to provide different switching voltages for the relevant output nodes. For instance, to provide switching voltages at the first output node 104-1, switch 203a1 could be closed to provide an output of VSH and switch 203b1 could be closed to provide an output of VSH. In one of these states, the capacitor can be connected between the high and low supply voltages VSH and VSL to be charged to the input voltage Vin. The capacitor can be charged such that the plate connected to node 601 is positive, by closing switch 203d and 602-1 when switch 203a1 is closed, or negative, by closing switch 203c and 602-1 when switch 203b1 is closed. If the capacitor is charged such the plate connected to node 601 is positive, the capacitor can be connected to boost the voltage at the first driver output node 104-1 to VSH+Vin by closing switches 203c and 602-1. If, instead, the plate connected to node 601 is negative, the capacitor can be connected to boost the voltage at the first driver output node 104-1 to VSL−Vin by closing switches 203d and 602-1. The same operation can be applied for the second driver output node 104-2 using switches 203a2 and 203b2 and 602-2.

Where the voltage at driver output node can be selectively varied between VSL, VSH and VSH+Vin, one side of the load may be held at the low-side supply voltage VSL whilst the other side of the load is selectively switched between VSL, VSH and VSH+Vin to provide differential voltages of 0V or magnitudes of Vin or 2Vin of one polarity, and vice versa for the other polarity. Alternatively, where the voltage at driver output node can be selectively varied between VSL, VSH and VSL−Vin, one side of the load may be held at the high-side supply voltage VSH whilst the other side of the load is selectively switched between VSL, VSH and VSL−Vin to provide differential voltages of 0V or magnitudes of Vin or 2Vin of one polarity, and vice versa for the other polarity (although in this case, for positive voltages, it will be positive output node that is held at the supply voltage VSH whilst the voltage at the other driver output node is varied). This switching driver is thus operable to generate differential voltages of any of +2Vin, +Vin, 0V, −Vin or −2Vin using just one capacitor.

In any of the embodiments, the switches of the network of switches may be implemented by MOS switches. In at least some embodiments, each of the switches may comprise one or more NMOS devices. In at least some implementations at least some of the NMOS device may comprise a bootstrap circuit, as would be understood by one skilled in the art. The use of bootstrapped NMOS devices can be advantageous in terms of power consumption. In addition, NMOS devices can be implemented in a smaller circuit area than a corresponding PMOS device. Typically an NMOS transistor may take up an area which is about 2.5 times less than a corresponding PMOS transistor. Generally a smaller circuit area is desirable in times of size and cost of the integrated circuit. It can therefore be advantageous in terms of power and/or area to implement the network of switches using only, or predominantly, using NMOS devices (rather than PMOS devices). The implementation of a switching driver having a switch network for selectively boosting the switching voltages where the switching network is implemented, wholly or mainly, using NMOS devices represents a novel aspect of this disclosure. However, in some applications at least some PMOS devices may be used for one or more of the switches.

When the switch network is implemented using NMOS devices, the switch network may be configured so as the avoid unwanted conduction via a body diode of some of the NMOS devices in at least some switching states.

Figure 8:
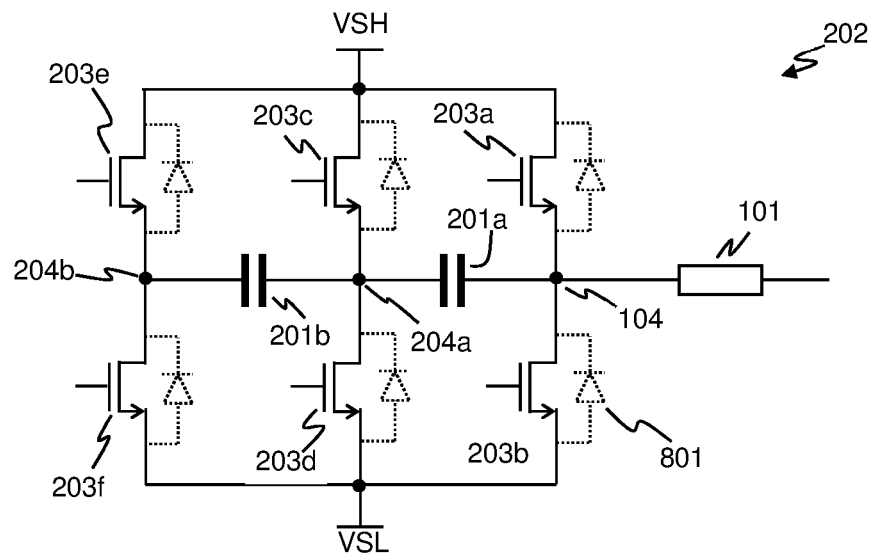
FIG. 8 illustrates a switching driver implemented using MOS devices.

FIG. 8 illustrates an example of the structure of switching driver 202, described with respect to FIG. 2, illustrating each of the switches 203a-f as a single NMOS device. FIG. 8 also illustrates that, as will be understood by one skilled in the art, each NMOS device will have an associated body diode. For this example, operation of the device in the various states described above could result in unwanted conduction via the body diodes of the NMOS devices.

Consider that the high-side supply voltage is a positive supply voltage Vin and the low-side supply voltage VSL is ground. In the switch state illustrated in FIG. 3a, where switches 203a and 203d are on (closed), the second capacitor node 204a will be driven to ground. If the second capacitor is charged, e.g. due to previous operation in the switch state 3c, the voltage on the second capacitor 201b will cause the voltage at the third capacitor node 204b to be driven below ground, e.g. to −Vin. Thus, the voltage at the third capacitor node 204b is below the low-side voltage which can forward bias the body diode 801 of switch 203f, which may cause this diode to effectively turn-on and conduct, which will result in unwanted operation and excess power consumption. Likewise, in the switch state illustrated in FIG. 3b, where switch 203b is on (closed), the output node 104 will be driven to ground and, the voltages on the first and second capacitors 201a and 201b will cause the voltages at the second and third capacitor nodes 204a and 204 to be driven below ground, e.g. to −Vin and −2Vin respectively. This could cause the body diodes 801 of the switches 203d and 203f to effectively turn-on and conduct.

Figure 3D:
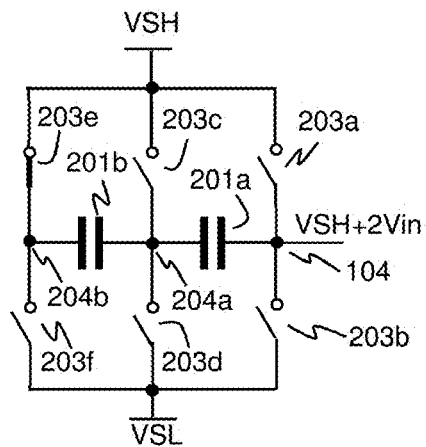

A similar issue can arise in the state illustrated in FIG. 3c, where the output node is driven to a voltage of +2Vin, which is greater than the high-side supply voltage VSH, which can forward bias the body diode of switch 203a, or in the switch state illustrated in FIG. 3d, where the voltages at the second capacitor node 204a and output node/first capacitor node 104 are +Vin and +2vin respectively and thus greater than the high-side supply, which could forward bias the body diodes of switches 203c and 203a.

Figure 9:
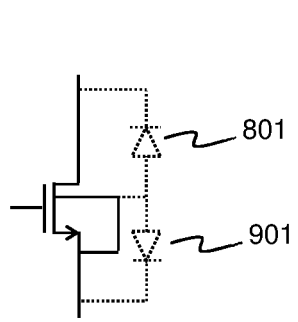
FIG. 9 illustrates a conventional bulk connection for a MOS device.

In some embodiments, to prevent such unwanted conduction via the body diodes, the relevant NMOS devices may be implemented with controllable switching of the bulk terminal. As one skilled in the art will understand, a MOS device may typically be implemented with the bulk or body term tied to the source terminal, such as illustrated in FIG. 9. FIG. 6 also illustrates that there may, in practice, be two body diodes 801 and 901, between the bulk terminal and the drain and source. In some embodiments, the bulk terminal may instead be controllably switched.

Figure 10:
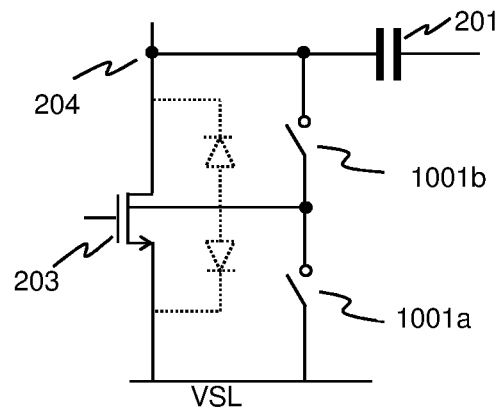
FIG. 10 illustrates a bulk switching arrangement for a MOS switch.

FIG. 10 illustrates one example of a suitable bulk switching arrangement for an NMOS device implemented as one of the switches 203, for instance as switch 203d or switch 203f. The bulk terminal of the NMOS switch 203 may be selectively coupled to the source terminal or, in this case, to the drain terminal connected to the capacitor node 204 by switches 1001a and 1001b. Switches 1001a and 1001b may be implemented by small MOS devices.

In use, in states where the voltage at node 204 will be at, or above, the low-side supply voltage VSL, the bulk terminal may be switched to the low-side supply voltage, e.g. connected to the source terminal as conventional. Body diode 801 remains reverse biased and there is no voltage difference across body diode 901. In any switch state where the voltage at capacitor node 204 may be driven below the low-side supply voltage VSL, e.g. below ground by the voltage stored on capacitor 201, the bulk of NMOS switch can instead be switched to connect to node 204. This result in no voltage differential across the body diode 801 and prevents unwanted conduction. In this case body diode 901 is reverse biased.

A similar arrangement could be implemented for the switches 203a or 203c, with the bulk being switched to the source terminal connected to the capacitor node when the voltage at that node is equal to, or more negative than the high-side supply, but connected to the high-side voltage when the voltage at the capacitor node is more positive than the high-side supply voltage VSH.

Figure 11:
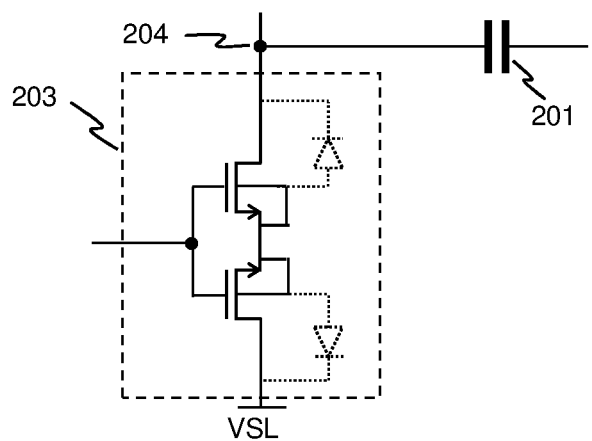
FIG. 11 illustrates implementation of a switch using series connected MOS devices.

For some NMOS devices, however, bulk switching may not be desirable. For instance for some drain engineered devices, such as LDMOS devices, it may be desirable to avoid bulk switching to avoid back biasing effects. As an alternative to bulk switching, the relevant switch could instead be implemented by two back-to-back NMOS devices connected in series, as illustrated in FIG. 11. FIG. 11 illustrates that a switch 203, for instance switch 203d or switch 203f, may be implemented by two MOS devices in series. The devices are arranged back-to-back so that the (bulk-drain) body diodes of the two devices effectively oppose one another. In this way, if the voltage at node 204 drops below the low-side supply voltage VSL, in a way that would cause one of the body diodes to conduct, the other body diode will be reverse biased and thus block conduction. Note FIG. 8 illustrates a back-to-back arrangement where the sources of the devices are coupled together on the inside of the connection, but it would be alternatively possible to couple the devices via the drains, although that would require separate gate drive signals for correct operation. Which of these configurations to use may be selected based on the relevant application and characteristics of the devices.

Figure 12:
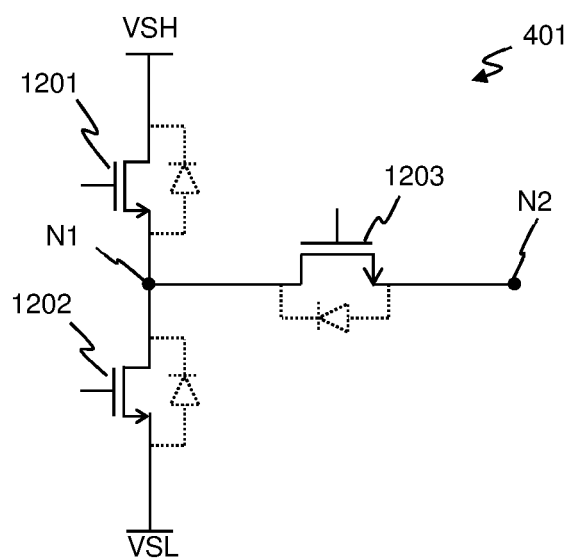
FIG. 12 illustrates implementation of a switching leg using three NMOS devices.

In some embodiments, a switching leg or branch 401 could be implemented with NMOS devices for the switches of the switching leg, with at least one additional transistor coupled between the midpoint switching node and a node which couples to another switching leg. FIG. 12 illustrates an example of a switching leg 401 comprising NMOS transistors 1201 and 1202 connected between the high and low-side supply voltages VSH and VSL and a midpoint switching node N1 respectively. The switching node N1 is connected to a node N2, via an additional NMOS transistor 1203 and the node N2 would be coupled to the relevant capacitor node for that leg. The additional transistor 1203 is arranged so as to prevent unwanted conduction when the voltage at node N2 exceeds one of the supply voltages. In the example of FIG. 12, the additional transistor 1203 is arranged to prevent conduction in the event that the voltage at node N2 is more negative than the low-side supply VSL. Such a switching leg could be used to provide the switches 203e and 203f of the driver of FIG. 2 when operable in the switch states illustrated in FIGS. 3a-3d and thus node N2 could be connected to the second capacitor node 204a.

In use, to provide the switch states of FIGS. 3c and 3d, one of transistors 1202 or 1201 will be turned-on, together with additional transistor 1203, to drive nodes N1 and N2 to the low-side supply voltage VSL or the high side voltage VSH respectively. In either case the body diode of the other of transistors 1201 and 1202 will be reverse biased.

For the switch states of 3a and 3b, all of the transistors 1201, 1202 and 1202 may be off. The voltage at node N2 may, in these states, go more negative than the low-side supply voltage VSL as described previously, but in this case conduction from the low side supply to node N2 via transistors 1202 and 1203 is not possible due to the body diode of additional transistor 1203 being reverse biased.

FIG. 12 illustrates a switching leg that allows the voltage at node N2 to be equal to the high side supply voltage VSH, the low side supply voltage VSL or more negative than the low side supply voltage VSL, which for the switch states described in FIGS. 3a-3d is the case for the second capacitor node 204b. It will be understood that the connection of the additional transistor 1203 could be reversed, if instead the voltage at node N2 would not go more negative than the low-side voltage but could go more positive than the high-side voltage. For instance, for the switch states illustrated in FIGS. 3a-3d, the voltage at the output node 104 can be switched to VSL, VSH or a voltage which is more positive than VSH. Thus the switching leg providing switches 203a and 203b could be implemented by arrangement similar to that illustrated in FIG. 12, with the node N2 being the first capacitor node/driver output node 104, but with the reverse connection of the additional transistor 1203. For the switching leg coupled to the second capacitor node 204a, as this node can be driven more positive than VSH and also separately more negative than VSL, such an arrangement may not be suitable and each of the switches 203c and 203d could, for example, be implemented as back-to-back switches such as illustrated in FIG. 11.

Thus, in implementations where the switches of the switch network are implemented using NMOS devices, at least some of the switches may be implemented by multiple NMOS devices and/or with bulk switching or the like to ensure correct operation. The exact implementation for an individual switch may depend on its position in the switch network and the various voltages that may be generated in use, as will be understood by one skilled in the art.

In some implementations, however, at least one switching leg may be implemented with first and second switches each implemented as a single conventional NMOS device, without the need for bulk switching.

For example, referring back to FIG. 7, the switches 203c and 203d may each be implemented by a conventional NMOS device. As discussed above, the driver 700 of FIG. 7 can be operated to switch between three different voltages at the first driver output node 104-1, whilst the second driver output node 104-2 is held at a constant voltage such as one of the low-side voltage VSL or the high side voltage VSH.

Consider the operation where one of the driver output nodes, say the second driver output node 104-2, is held at the low side switching voltage VSL, with switch 602-2 open, and the first driver output node is selectively switched, between VSL, VSH and VSH+Vin. In the state where the first output node 104-1 is driven to the low side supply voltage VSL, switch 203b1 will be on, but switch 602-1 can be off, to prevent the charged capacitor from driving the voltage at the capacitor node 204a below ground. To avoid the voltage at nodes 204a and 601 from floating, switch 203d could be on to drive the capacitor node 204a to VSL, which will result in the voltage at node 601 being equal to VSL+Vin, i.e. VSH. In the state where the first output node 104-1 is driven to the high side supply voltage VSH, switch 203a1 will be on, and switches 602-1 and 203d may be on to charge the capacitor. The voltages at nodes 204a and 601 will thus again be equal to VSL and VSH respectively. In the state where the first output node 104-1 is driven to VSH+Vin, switch 203c will be on with switches 602-1. The voltages at nodes 204a and 601 will be equal to VSH and VSH+Vin respectively.

Thus in each state the voltage at the capacitor node 204a is equal to or less positive than the high side supply voltage and equal to or more positive than the low side supply voltage. Thus, switches 203c and 203d can each be implemented by a single NMOS device without the need for any bulk switching. Also, in each state the voltage at node 601 is equal to or more positive than the voltage at the first output node 104-1 and the voltage at the second output node 104-2, thus each of switches 602-1 and 602-2 may be implemented by a single NMOS device arranged such that its body diode is reverse biased when the voltage at node 601 is more positive than the voltage at the relevant driver output node. In each state the voltage at the first output node is equal to or more positive than that low-side switching voltage, so switch 203*b*1 (and correspondingly switch 203*b*2) could be implemented by a single NMOS device. However, in the state where the voltage at the output node 104-1 is equal to VSH+Vin, this is more positive than the high side supply voltage and thus switch 203*a*1 may be implemented to prevent unwanted diode conduction, e.g. using back-to-back NMOS devices as discussed with reference to FIG. 11.

In the alternative approach, where one side of the load, e.g. the second driver output 104-2, is connected to the high side supply voltage VSH and the other side of the load, e.g. the first driver output node, is selectively driven by the VSH, VSL or VSL−Vin, the voltage at node 204*a* can again be controlled so as to not be more positive that the high side supply voltage VSH nor more negative than the low side supply voltage VSL, and thus again the switches 203*c* and 203*d* can be implemented by single NMOS devices. In this case, the voltage at node 601 may always be equal to or less positive than the voltages at the output nodes 104-1 and 104-2 and thus switches 602-1 and 602-2 may also be implemented by single NMOS devices, but oriented so their body diodes are reverse biased when the voltage at node 601 is less positive than the voltage at the relevant driver output node. In this case, the voltage at the output node 104-1 is equal to or less positive than the high side supply voltage VSH, but may be more negative than the low side supply voltage VSL, in which case switch 203*a*1 may be implemented by a single NMOS device, but switch 203*b*1 may be implemented, for instance, by back-to-back NMOS devices.

The switching driver of FIG. 7 is thus a switching driver which can be relatively very small in area due to the use of single NMOS devices for most of the switches. It will be appreciated that FIG. 7 illustrates a BTL configuration, but the principles apply to a single ended driver, in which case the switching leg 401-2 and switch 602-2 may be omitted.

A switching driver according to an embodiment may thus be comprising first and second switching legs, each switching leg comprising a switching node and a first switch for connecting the switching node of that switching leg to a high side voltage supply and a second switch for connecting the switching node of that switching leg to a low side voltage supply, wherein the switching node of the second switching leg is connected to the switching node of the first switching leg via a capacitor and a connection switch and wherein the first and second switches of the first switching leg are implemented by first and second NMOS transistors respectively. Thus, at least one switching leg comprises two NMOS devices in series, and the two NMOS devices may be connected by respective source and drain terminals. The bulk terminal of the first and second NMOS devices may each be connected to the respective source terminal.

In general, therefore, embodiments relate to switching driver circuits and methods for driving a transducer. The switching driver has supply nodes for receiving supply voltages defining at least one input voltage and at least a first driver output node for outputting a drive signal for the transducer and capacitor nodes for connecting, in use, to a plurality of capacitors. A network of switches is arranged to selectively connect the first and second supply nodes to the first driver node or to the capacitor nodes. The network of switches is operable such that each of the capacitors can be selectively connected between respective supply nodes to be charged and operable such that a supply node can be connected to the first driver output node with selectively none, one or more of the capacitors in a path between the relevant supply node and the first driver output node.

Embodiments relate to a switching driver that may be arranged as a single-ended driver for driving a load and also to embodiments having two switching drivers for driving the load in a bridge-tied-load configuration.

As mentioned, the switching driver may be suitable for driving an output transducer. The output transducer may be, in some implementations, be an audio output transducer such as a loudspeaker or the like. The output transducer may be a haptic output transducer. In some implementation the output transducer may be driven in series with an inductor, i.e. there may be an inductor in an output path between an output node of the switched driver and the load. In some implementations the transducer may be a piezoelectric or ceramic transducer.

Embodiments may be implemented, at least partly, as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance aspects of controlling the switching control signals, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A switching driver apparatus for driving a transducer comprising:
    a plurality of supply nodes for receiving supply voltages defining at least one input voltage;
    a first switching driver having a driver output node, and
    a controller for controlling operation of the first switching driver based on an input signal to generate a drive signal for the transducer at the driver output node;
    wherein the first switching driver comprises:
    capacitor nodes for connecting, in use, to at least first and second capacitors such that the first capacitor is connected between first and second capacitor nodes and the second capacitor is connected between the second capacitor node and a third capacitor node; and
    a network of switches for selectively connecting any of the driver output node, the second capacitor node and the third capacitor node to either of a respective pair of said supply nodes, with the first capacitor node connected to the first driver output node.

2. The switching driver apparatus of claim 1 wherein the plurality of supply nodes comprises a first supply node and a second supply node and the controller is operable to control the network of switches in each of:
    a first switch state in which the first supply node is coupled to the driver output node, the driver output node is coupled to the first capacitor node and the second supply node is coupled to the second capacitor node;
    a second switch state in which the second supply node is connected to the driver output node;
    a third switch state in which the driver output node is coupled to the first capacitor node, the first supply node is coupled to the second capacitor node and the second supply node is coupled to the third capacitor node; and
    a fourth switch state in which the driver output node is coupled to the first capacitor node and the first supply node is coupled to the third capacitor node.

3. The switching driver apparatus of claim 2 wherein the controller is operable to control the first switching driver in a first driver mode which switches between the first switch state and the second switch state.

4. The switching driver apparatus of claim 3 wherein the controller is operable to control the first switching driver in a second driver mode which switches between the third switch state and the first switch.

5. The switching driver apparatus of claim 4 wherein the controller is operable to control the first switching driver in a third driver mode which switches the fourth switch state and the third switch state.

6. The switching driver apparatus of claim 1 wherein the network of switches comprises:
    a first switch for selectively connecting the driver output node to a first supply node;
    a second switch for selectively connecting the driver output node to a second supply node;
    a third switch for selectively connecting the second capacitor node to the first supply node;
    a fourth switch for selectively connecting the second capacitor node to the second supply node;
    a fifth switch for selectively connecting the third capacitor node to the first supply node; and
    a sixth switch for selectively connecting the third capacitor node to the second supply node.

7. The switching driver apparatus of claim 6 wherein the network of switches further comprises a seventh switch for selectively connecting the first capacitor node to the driver output node.

8. The switching driver apparatus of claim 7 further comprising a second driver output node, wherein the network of switches further comprises:
- an eighth switch for selectively connecting the second driver output node to the first supply node;
- a ninth switch for selectively connecting the second driver output node to the second supply node; and
- a tenth switch for selectively connecting the first capacitor node to the second driver output node.

9. The switching driver apparatus of claim 1 wherein the switch network is configured such that one of the driver output node, second capacitor node and third capacitor node may be selectively connected to a first pair of supply nodes and another of the driver output node, second capacitor node and third capacitor node may be selectively connected to a second pair of supply nodes, wherein at least one of the supply voltages of the first pair of supply nodes is different to the supply voltages of the second pair of supply nodes.

10. The switching driver apparatus of claim 1 wherein each of the switches of the network of switches comprises a NMOS transistor.

11. The switching driver apparatus of claim 10 wherein at least some of the NMOS switches comprise a bootstrap circuit.

12. The switching driver apparatus of claim 10, wherein the network of switches is operable such that, in use, the voltage of at least one of the second and third capacitor nodes may go negative and where a switch of the switch network which is connected between one of the second and third capacitor nodes and the second supply node is configured to prevent conduction via a body diode.

13. The switching driver apparatus of claim 1 wherein the first and second capacitors have the same electrical properties and dimensions as one another.

14. The switching driver apparatus of claim 2 further comprising:
- a second switching driver having a respective driver output node, wherein the switching driver apparatus is configured to drive the transducer in a bridge-tied-load (BTL) configuration between the driver output nodes of the first and second switching drivers.

15. The switching driver apparatus of claim 14 wherein the controller is operable:
- in a first BTL mode to control the network of switches of one of the first and second switching drivers in the first switch state and the network of switches of the other one of the first and second switching drivers in the second switch state to generate a differential voltage across the load with a magnitude equal to the input voltage;
- in a second BTL mode to control the network of switches of one of the first and second switching drivers in the third switch state and the network of switches of the other one of the first and second switching drivers in the second switch state to generate a differential voltage across the load with a magnitude equal to twice the input voltage; and
- in a third BTL mode to control the network of switches of one of the first and second switching drivers in the fourth switch state and the network of switches of the other one of the first and second switching drivers in the second switch state to generate a differential voltage across the load with a magnitude equal to three time the input voltage.

16. The switching driver apparatus of claim 11 wherein the controller is operable to selectively control one of the first and second switching drivers to switch its respective output node between different switching voltages over the course of a switching cycle whilst the other of the first and second switching drivers maintains a constant voltage.

17. The switching driver apparatus of claim 1 wherein said transducer is at least one of: an audio output transducer; a haptic output transducer; a piezoelectric transducer; and a ceramic transducer.

18. A switching driver apparatus for driving a transducer comprising:
- first and second supply nodes for receiving first and second supply voltages defining an input voltage;
- a first driver output node for outputting a drive signal for the transducer,
- capacitor nodes for connecting, in use, to a plurality of capacitors; and
- a network of switches selectively connecting said first and second supply nodes to said first driver node or the capacitor nodes, the network of switches being operable such that each of the plurality of capacitors can be selectively connected between the first and second supply nodes to be charged to the input voltage and operable such that the first supply node can be connected to the first driver output node with selectively none, one or more of the plurality of capacitors in a path between the first supply node and the first driver output node.

19. The switching driver apparatus of claim 18 further comprising:
- a second driver output node for driving a transducer in a bridge-tied-load configuration between the first and second driver output nodes, and
- capacitor nodes for connecting, in use, to a second plurality of capacitors;
- wherein the network of switches is operable such that each of the second plurality of capacitors can be selectively connected between the first and second supply nodes to be charged to the input voltage and operable such that the first supply node can be connected to the second driver output node with selectively none, one or more of the second plurality of capacitors in a path between the first supply node and the second driver output node.

* * * * *